(12) United States Patent
Stokes

(10) Patent No.: US 12,028,050 B1
(45) Date of Patent: Jul. 2, 2024

(54) BULK ACOUSTIC WAVE FILTER WITH REDUCED SECOND HARMONICS GENERATION

(71) Applicant: Global Communication Semiconductors, LLC, Torrance, CA (US)

(72) Inventor: Robert B. Stokes, Rancho Palos Verdes, CA (US)

(73) Assignee: Global Communication Semiconductors, LLC, Torrance, CA (US)

( * ) Notice: Subject to any disclaimer, the term of this patent is extended or adjusted under 35 U.S.C. 154(b) by 453 days.

(21) Appl. No.: 17/346,135

(22) Filed: Jun. 11, 2021

(51) Int. Cl.
*H03H 9/60* (2006.01)
*H03H 9/02* (2006.01)
*H03H 9/205* (2006.01)

(52) U.S. Cl.
CPC ........ *H03H 9/605* (2013.01); *H03H 9/02023* (2013.01); *H03H 9/205* (2013.01)

(58) Field of Classification Search
CPC ..... H03H 9/605; H03H 9/02023; H03H 9/205
See application file for complete search history.

(56) References Cited

U.S. PATENT DOCUMENTS

2008/0252398 A1* 10/2008 Jamneala ............... H03H 9/605
    333/189
2019/0341903 A1* 11/2019 Kim ................... H03H 9/02086

\* cited by examiner

*Primary Examiner* — Daniel C Puentes
(74) *Attorney, Agent, or Firm* — Maiorana Patent Law, PA

(57) ABSTRACT

An apparatus includes a first filter and a second filter. The first filter generally comprises a first plurality of resonators. The second filter generally comprises a second plurality of resonators. The first plurality of resonators generally comprise piezoelectric material. The second plurality of resonators generally comprise piezoelectric material. At least two of the first plurality of resonators are arranged in series between a signal input of the first filter and a signal output of the first filter. At least two of the second plurality of resonators are arranged in series between a signal input of the second filter and a signal output of the second filter. The second plurality of resonators are reverse connected relative to the first plurality of resonators. The first filter is generally connected in parallel with the second filter such that (a) the signal input of the first filter is connected to the signal input of the second filter, (b) the signal output of the first filter is connected to the signal output of the second filter, and (c) second harmonic emissions of the first filter are substantially canceled by second harmonic emissions of the second filter. The apparatus generally comprises a bulk acoustic wave (BAW) filter.

20 Claims, 9 Drawing Sheets

ELECTRODE
CONNECTIONS
REVERSED

PIEZOELECTRIC
CRYSTAL ORIENTATION
REVERSED

BULK ACOUSTIC WAVE FILTER WITH REDUCED SECOND HARMONICS GENERATION

FIELD OF THE INVENTION

The invention relates to radio frequency filters generally and, more particularly, to a method and/or apparatus for implementing a bulk acoustic wave filter with reduced second harmonics generation.

BACKGROUND

Conventional filter implementation sometimes involves replacing at least one thin-film bulk acoustic resonator (FBAR) in a ladder filter with a pair of FBARS with the same resonant frequencies connected in antiparallel. Antiparallel means the electrode connections to one of the parallel pair of FBARs are reversed. Reversing the electrode connections of a FBAR is equivalent to depositing a piezoelectric layer of the FBAR upside down (e.g., c-axis down instead of up in aluminum nitride (AlN) technology). If each FBAR of the pair of FBARs is scaled to approximately half the area of the original unscaled (or full-area) FBAR, the combined pair of FBARs will have essentially the same impedance as the original full-area single FBAR and will essentially perform similarly (neglecting harmonics).

Each of the two FBARs of an anti-parallel connected pair of FBARs have 2nd harmonics generated by strong filter input signals through piezoelectric layer nonlinearities. The 2nd harmonics generated in the normally connected FBAR and the 2nd harmonics generated in the reverse connected FBAR in the anti-parallel connected pair of FBARs will have the same amplitude but opposite phases, causing the 2nd harmonics generated by the antiparallel FBARs to essentially cancel out.

The existing filter implementation technique includes optional antiparallel and antiseries connections. The existing filter implementation technique also includes the options of doing the replacement for just a single FBAR (probably near the filter output), doing the replacement for more than one individual FBAR, or doing the replacement for each of the FBARs in the filter.

It would be desirable to implement a bulk acoustic wave filter with reduced second harmonics generation.

SUMMARY

The invention concerns an apparatus comprising a first filter and a second filter. The first filter generally comprises a first plurality of resonators. The second filter generally comprises a second plurality of resonators. The first plurality of resonators generally comprise piezoelectric material. The second plurality of resonators generally comprise piezoelectric material. At least two of the first plurality of resonators are arranged in series between a signal input of the first filter and a signal output of the first filter. At least two of the second plurality of resonators are arranged in series between a signal input of the second filter and a signal output of the second filter. The second plurality of resonators are generally reverse connected relative to the first plurality of resonators. The first filter is generally connected in parallel with the second filter such that (a) the signal input of the first filter is connected to the signal input of the second filter, (b) the signal output of the first filter is connected to the signal output of the second filter, and (c) second harmonic emissions of the first filter are substantially canceled by second harmonic emissions of the second filter. The apparatus generally comprises a bulk acoustic wave (BAW) filter.

BRIEF DESCRIPTION OF THE FIGURES

Embodiments of the invention will be apparent from the following detailed description and the appended claims and drawings.

Figure 3:
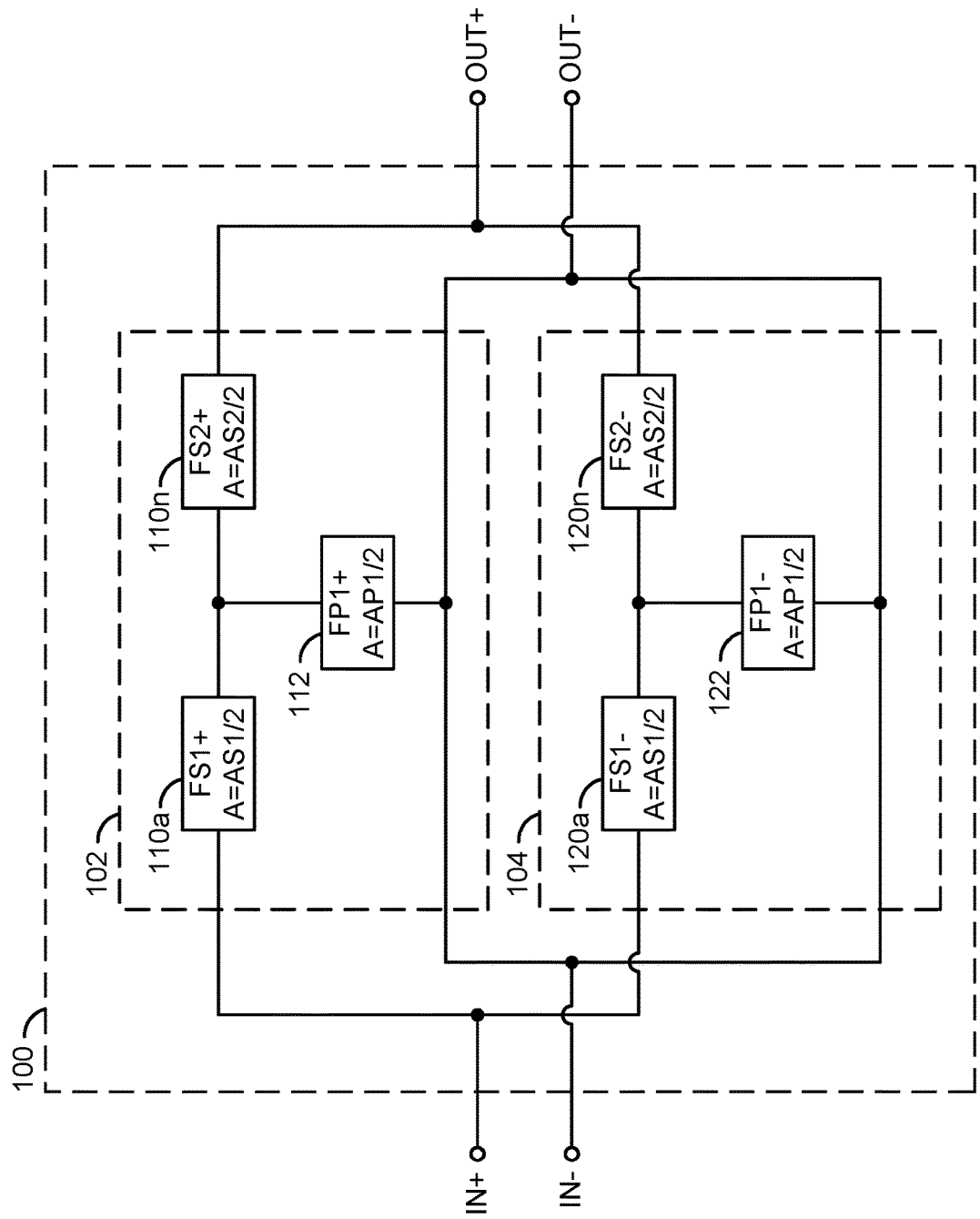
FIG. 3 is a diagram illustrating an example alternative implementation of the filter design of FIG. 1 using two half-area filter circuits in accordance with an embodiment of the invention to provide better performance than the filter circuit of FIG. 1.

FIG. is a diagram illustrating an example implementation of the filter 102 of FIG. 3 in accordance with an example embodiment of the invention.

Figure 6:
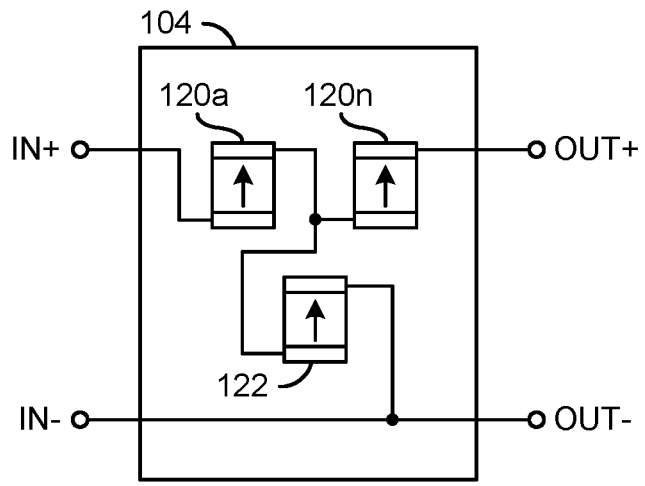

FIG. 6 is a diagram illustrating an example implementation of the filter 104 of FIG. 3 in accordance with an example embodiment of the invention.

Figure 7:
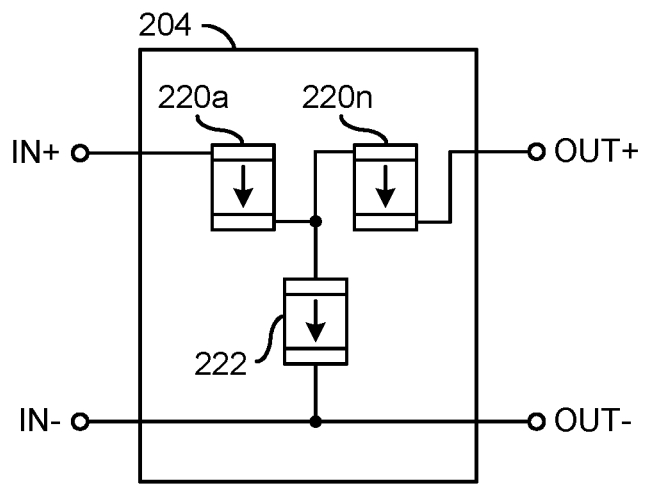

FIG. 7 is a diagram illustrating another example implementation of the filter 104 of FIG. 3 in accordance with an example embodiment of the invention.

Figure 1:
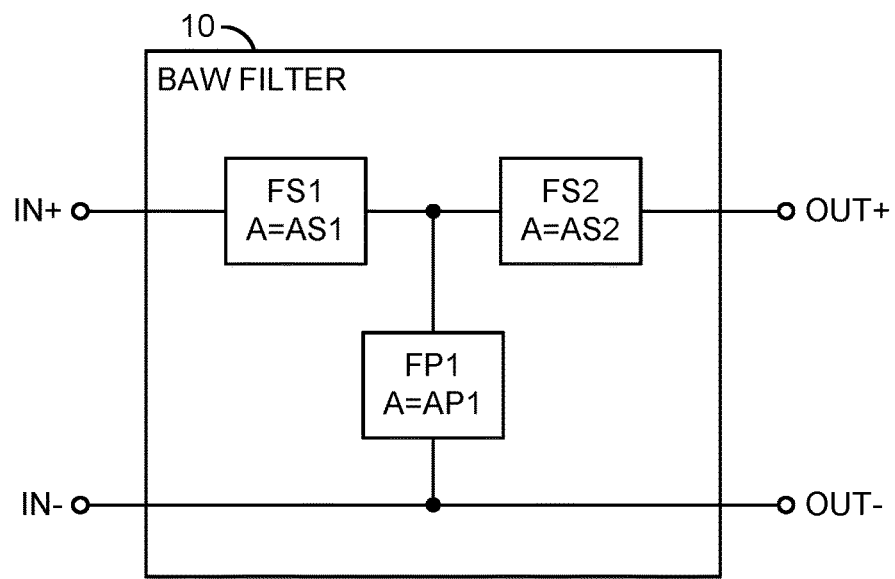
FIG. 1 is a block diagram illustrating an example filter circuit design.
Figure 8:
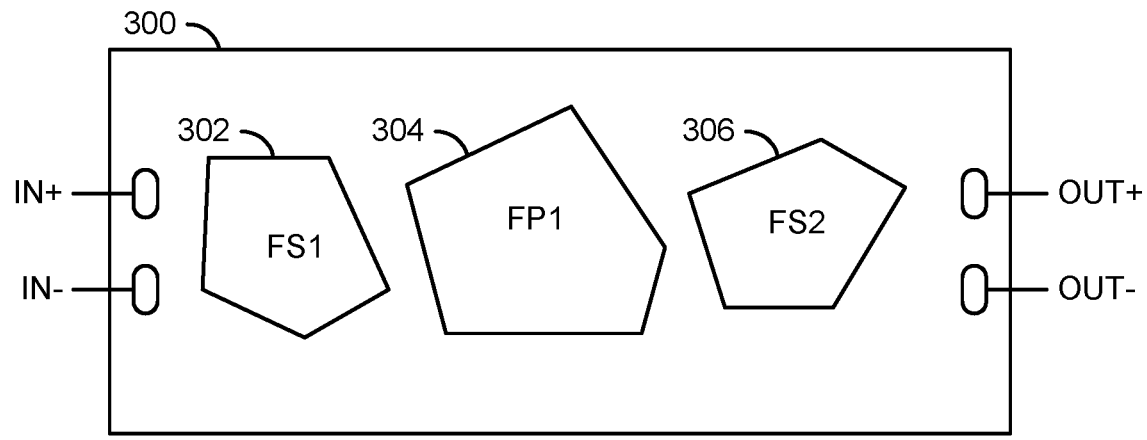
Figure 8:
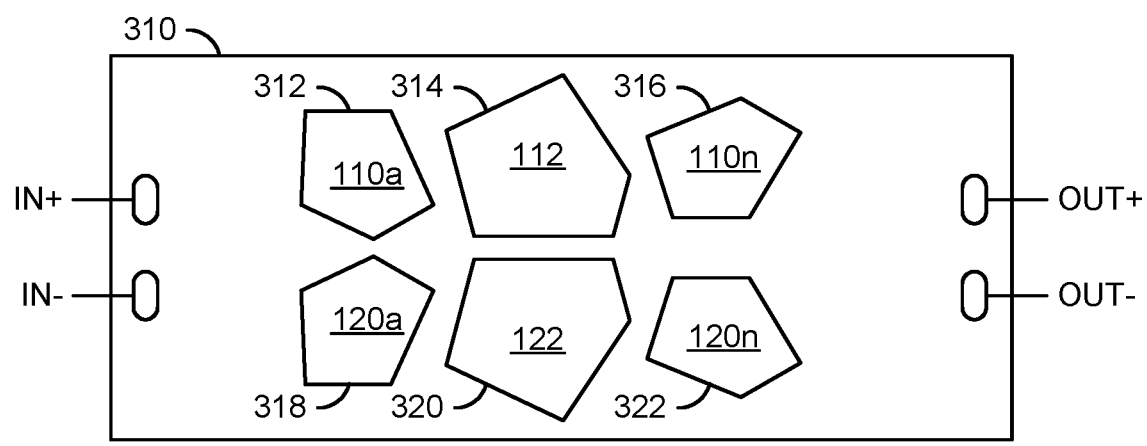

FIG. 8 is a top view diagram illustrating example wafer implementations of the filters of FIGS. 1 and 3 in accordance with an example embodiment of the invention.

Figure 9:
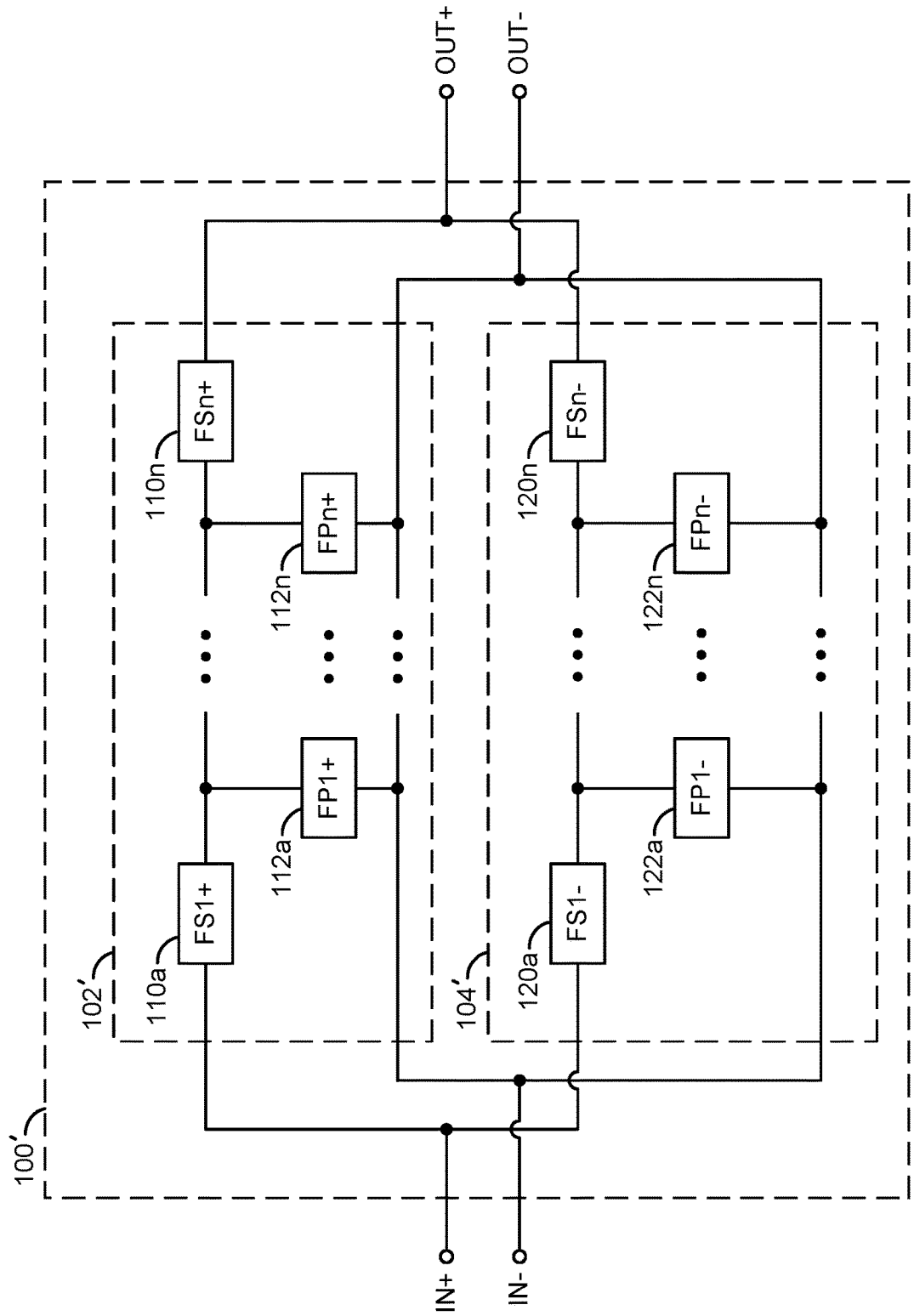

FIG. 9 is a diagram illustrating another example implementation of a filter design in accordance with an embodiment of the invention.

Figure 10:
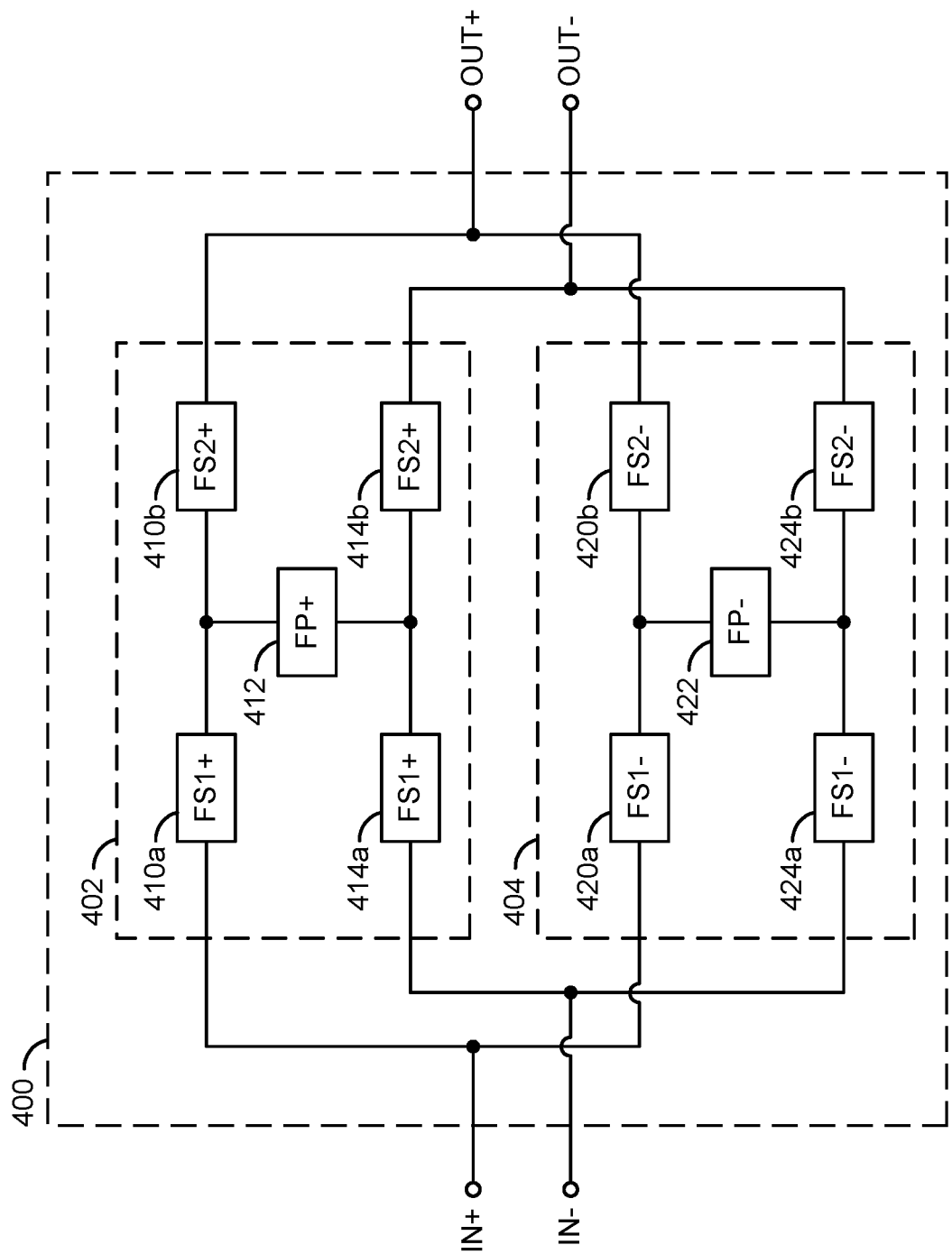

FIG. 10 is a diagram illustrating another example implementation of a filter design in accordance with an embodiment of the invention.

Figure 11:
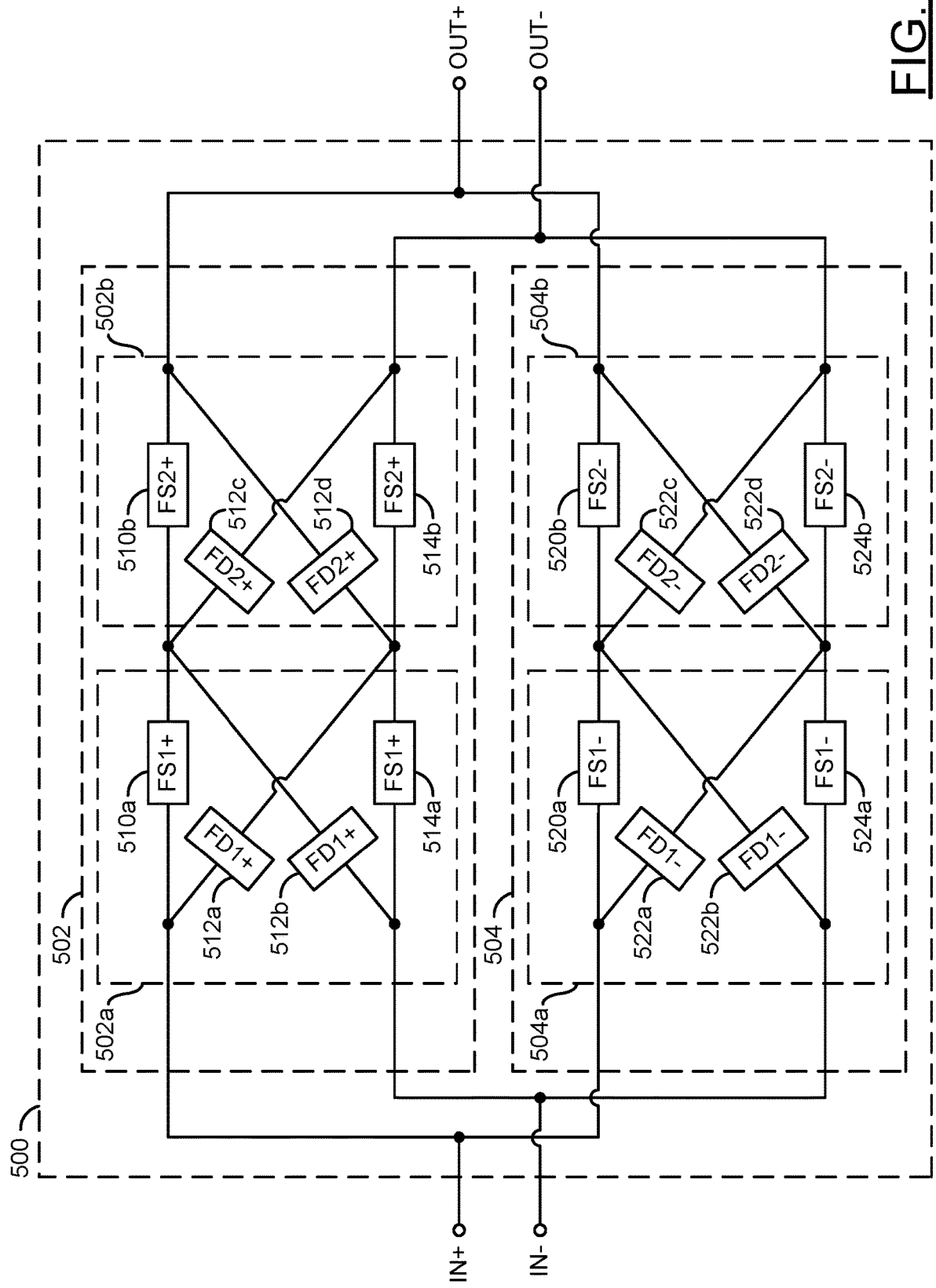

FIG. 11 is a diagram illustrating another example implementation of a filter design in accordance with an embodiment of the invention.

Figure 12:
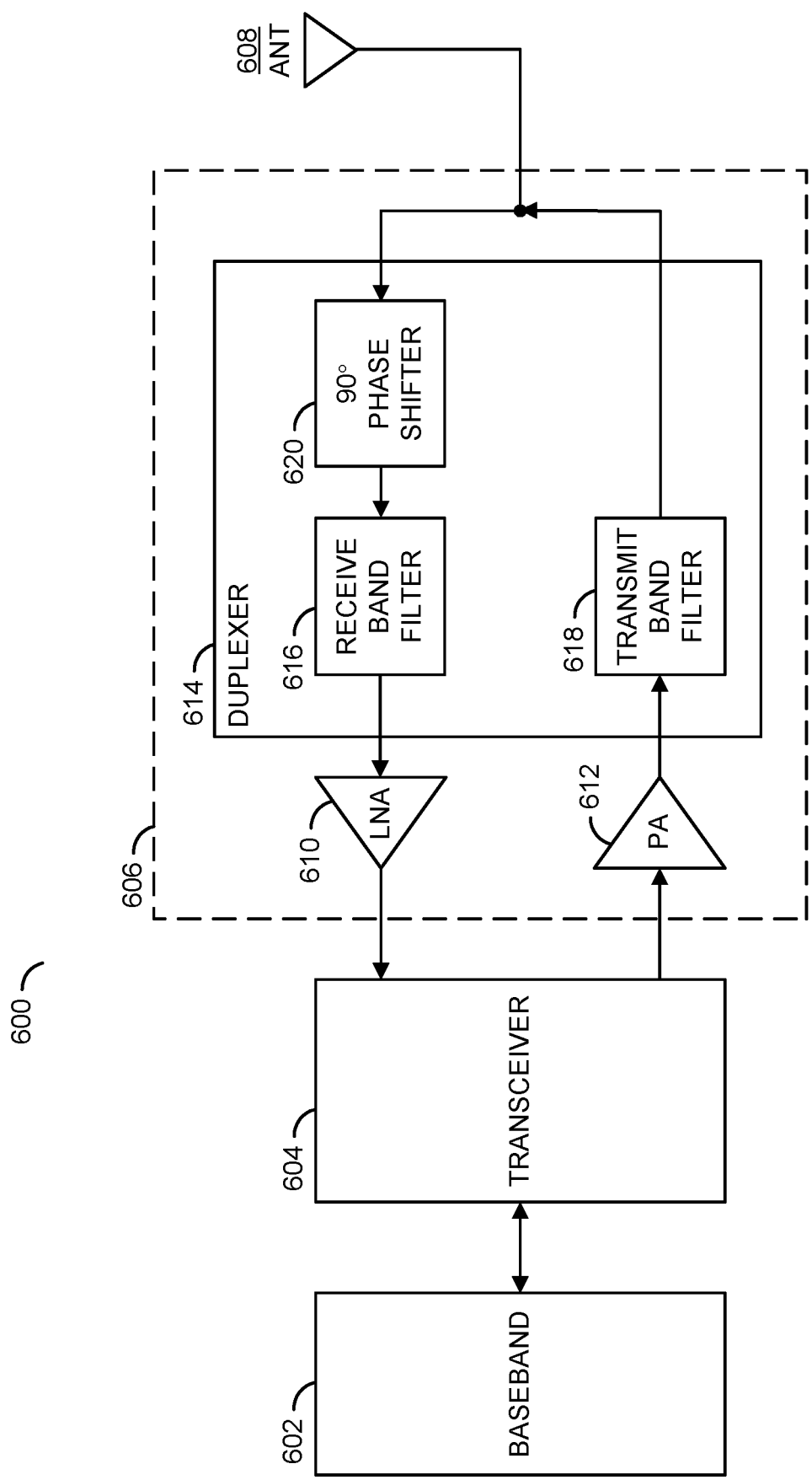

FIG. 12 is a diagram illustrating a context in which a filter in accordance with an example embodiment of the invention may be implemented.

DETAILED DESCRIPTION OF THE EMBODIMENTS

Embodiments of the present invention include providing a bulk acoustic wave filter with reduced second harmonics generation that may (i) implement a filter design as two filter circuits connected in parallel, (ii) configure the two filter circuits having resonators with opposite piezoelectric crystal orientation or reverse electrode connections, (iii) implement filters using thin-film bulk acoustic resonators (FBARs) or solidly mounted resonators (SMRs), (iv) implement a filter using resonators having substantially the same resonant frequencies but acoustically active areas that are scaled to approximately one-half of the acoustically active areas of corresponding resonators in an equivalent (neglecting harmonics) conventional filter design, (v) implement a filter using resonators having acoustically active areas that are substantially similar in shape to corresponding resonators in the conventional filter design, (vi) be used to implement balanced and unbalanced filter topologies, (vii) be used to implement filter topologies with multiple stages, and/or (viii) be implemented as a monolithic microwave integrated circuit (MMIC).

In the description below, normally connected bulk acoustic wave (BAW) resonators (e.g., FBARS) are generally indicated with the symbol "+". BAW resonators that are reverse connected (e.g., have electrode connections swapped or have an inverted crystal orientation) are generally indicated with the symbol "−". A BAW resonator that is scaled to approximately half the area of an original unscaled (or full-area) BAW resonator but has substantially the same resonant frequencies as the original unscaled BAW resonator is generally referred to as a half-area BAW resonator. In general, BAW resonators have two fundamental resonant frequencies, because there is a parallel resonance and a series resonance. A BAW filter comprising half-area BAW resonators is generally referred to as a half-area BAW filter.

Referring to FIG. 1, a block diagram of a filter circuit 10 is shown illustrating an example filter circuit design. In an example, the filter circuit 10 may comprise a bulk acoustic wave (BAW) filter. In an example, the filter circuit 10 is shown having a single stage unbalanced T-section circuit topology for simplicity in drawing and discussion. However, it would be apparent to a skilled artisan that filter circuits may be implemented using balanced and unbalanced circuit topologies comprising one or more sections (or stages), a plurality of series branches, and/or a plurality of shunt branches, and/or a plurality of diagonal branches (e.g., described below in connection with FIGS. 9-11).

The filter circuit 10 generally has a signal input and a signal output. In an example, the signal input may comprise a first terminal IN+ and a second terminal IN−, and the signal output may comprise a third terminal OUT+ and a fourth terminal OUT−. In embodiments implementing an unbalanced filter topology, the signal input terminal IN− may be connected directly with the signal output terminal OUT−. In an example, the signal input terminal IN− and the signal output terminal OUT− may be connected to a circuit reference potential (e.g., ground potential).

In an example embodiment, the filter circuit 10 may comprise three BAW resonators FS1, FS2, and FP1. In an example, each of the three BAW resonators may be implemented as a thin-film bulk acoustic resonator (FBAR). In another example, each of the three BAW resonators may be implemented as a solidly mounted resonator (SMR). The signal input terminal IN+ may be connected to a first terminal (or electrode) of the first BAW resonator FS1. A second terminal (or electrode) of the first BAW resonator FS1 may be connected to a first terminal (or electrode) of the second BAW resonator FS2 and a first terminal (or electrode) of the third BAW resonator FP1. A second terminal (or electrode) of the second BAW resonator FS2 may be connected to the signal output terminal OUT+. A second terminal (or electrode) of the third BAW resonator FP1 may be connected to the signal input terminal IN− and the signal output terminal OUT−. In an example, the second terminal (or electrode) of the third BAW resonator FP1 may be connected to the circuit ground potential. In an example, the first BAW resonator FS1 and the second BAW resonator FS2 may be referred to as series connected resonators. In an example, the third BAW resonator FP1 may be referred to as a shunt connected resonator.

In an example, the first BAW resonator FS1 may have a first acoustically active area (e.g., AS1), the second BAW resonator FS2 may have a second acoustically active area (e.g., AS2), and the third BAW resonator FP1 may have a third acoustically active area (e.g., AP1). In an example, the acoustically active areas AS1, AS2, and AP1 may be the same or different. In an example, the acoustically active area AP1 may be larger than the acoustically active area AS1 and/or the acoustically active area AS2.

Figure 2:
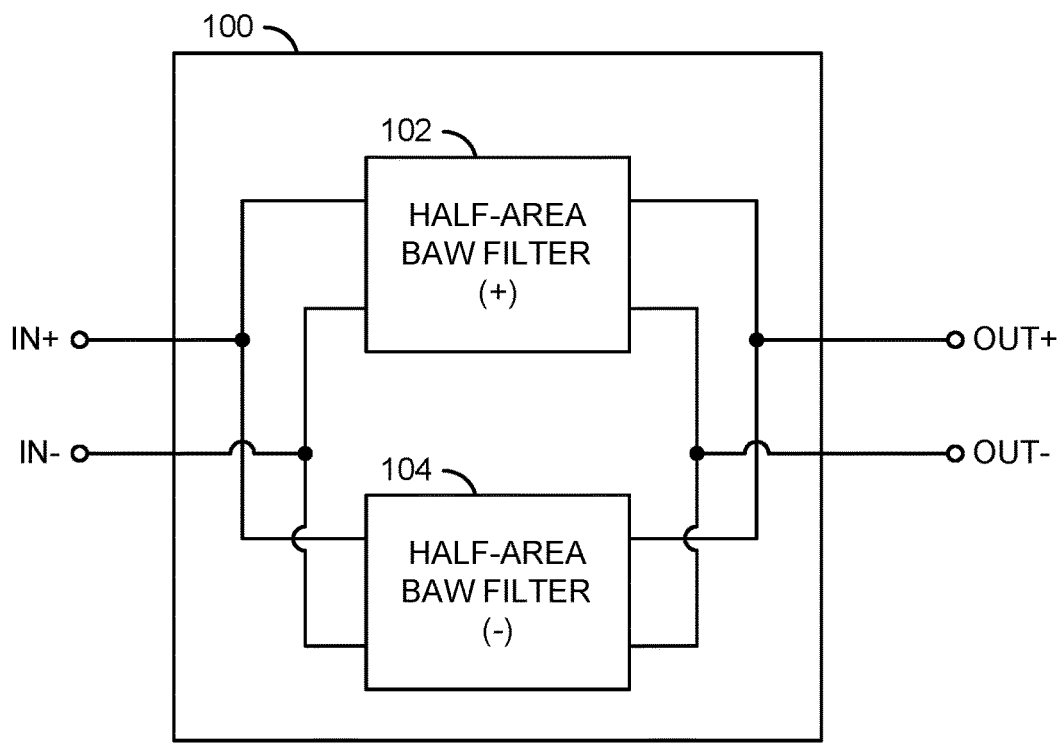
FIG. 2 is a schematic diagram illustrating an example implementation of a filter circuit comprising two half-area filter circuits in accordance with an embodiment of the invention.

Referring to FIG. 2, a schematic diagram is shown illustrating an example implementation of a filter circuit 100 using two filter circuits comprising half-area bulk acoustic wave (BAW) filters, with opposite piezoelectric crystal orientation or reversed electrode connections, connected in parallel in accordance with an example embodiment of the invention. In various embodiments, a filter scheme is provided that provides for 2nd harmonics cancellation at a whole filter level rather than at an individual BAW resonator level. In various embodiments, a first half-area BAW filter circuit 102 may be implemented comprising all the original BAW resonators of a conventional BAW filter design replaced with corresponding normally connected or non-inverted crystal orientation (+) half-area versions. A second half-area BAW filter 104 may be implemented identical to the first half-area BAW filter 102, except that all the half-area versions of the BAW resonators are reverse connected (e.g., connections to electrodes of each BAW resonator are swapped or a crystal orientation of each BAW resonator is inverted). The reverse connected BAW resonators are generally indicated by a minus symbol (−). Because the two half-area BAW filters 102 and 104 are essentially identical circuits except for the electrode connections or crystal orientation, phases of the 2nd harmonics generated in the respective filter outputs of the two half-area BAW filters 102 and 104 are opposite and have essentially equivalent amplitudes. Since the phases of the 2nd harmonics generated in the respective filter outputs of the two half-area BAW filters 102 and 104 are opposite and have essentially equivalent amplitudes, when the two half-area BAW filters 102 and 104 are connected in parallel at the whole filter level the 2nd harmonics generally cancel.

Simulations and symmetry arguments show that the two half-area BAW filters 102 and 104 connected in parallel have essentially the same performance (neglecting harmonics) as a single full-area filter implemented using the traditional technique. The two half-area BAW filters 102 and 104 combined also nominally take up a similar amount of chip area to the single full-area conventional BAW filter. Neglecting harmonics, the two half-area BAW filters 102 and 104 have the same input and output voltages. Since each BAW resonator in the two half-area BAW filters 102 and 104 is the same size and resonant frequencies as its twin in the other filter, each node generally has the same voltage as its twin in the other filter, hence generating the same magnitude 2nd harmonics.

Referring to FIG. 3, a diagram is shown illustrating an example alternative implementation of the filter design of FIG. 1 using two half-area filter circuits in accordance with an embodiment of the invention. In an example, the filter circuit 10 of FIG. 1 may be replaced by the filter circuit 100 comprising a first half-area bulk acoustic wave (BAW) filter 102 and a second half-area bulk acoustic wave (BAW) filter 104 connected in parallel in accordance with an example embodiment of the invention. In an example, each of the half-area bulk acoustic wave (BAW) filters 102 and 104 are illustrated, for clarity, as a bulk acoustic wave (BAW) filter comprising three resonators with an unbalanced T-section circuit topology. However, it would be apparent to a skilled artisan that the filters 102 and 104 may be implemented using balanced and unbalanced circuit topologies comprising one or more sections (or stages), a plurality of series branches, and/or a plurality of shunt branches, and/or a plurality of diagonal branches (e.g., described below in connection with FIGS. 9-11) to meet design criteria of a particular application.

In an example, the half-area bulk acoustic wave (BAW) filter 102 may comprise two series connected BAW resonators 110a and 110n, and a shunt connected BAW resonator 112. In an example, each of the three BAW resonators 110a, 110n, and 112 may be implemented as either normally connected (+) thin-film bulk acoustic resonators (FBARs) or normally connected (+) solidly mounted resonators (SMRs). In an example, the half-area bulk acoustic wave (BAW) filter 104 may comprise two series connected BAW resonators 120a and 120n, and a shunt connected BAW resonator 122. In an example, each of the three BAW resonators 120a, 120n, and 122 may be implemented as either reverse connected (−) thin-film bulk acoustic resonators (FBARs) or reverse connected (−) solidly mounted resonators (SMRs). In an example embodiment, the BAW resonators 110a, 110n, 112, 120a, 120n, and 122 may share the same piezoelectric layer. In another example embodiment using quartz, lithium niobate, or lithium tantalate as the piezoelectric crystal material, the BAW resonators 110a, 110n, 112, 120a, 120n, and 122 may be fabricated as single-resonator chips that are assembled together.

The signal input terminal IN+ may be connected to a first terminal (or electrode) of the BAW resonator 110a and a first terminal (or electrode) of the BAW resonator 120a. A second terminal (or electrode) of the BAW resonator 110a may be connected to a first terminal (or electrode) of the BAW resonator 110n and a first terminal (or electrode) of the BAW resonator 112. A second terminal (or electrode) of the BAW resonator 110n may be connected to the signal output terminal OUT+. A second terminal (or electrode) of the BAW resonator 112 may be connected to the signal input terminal IN− and the signal output terminal OUT−. A second terminal (or electrode) of the BAW resonator 120a may be connected to a first terminal (or electrode) of the BAW resonator 120n and a first terminal (or electrode) of the BAW resonator 122. A second terminal (or electrode) of the BAW resonator 120n may be connected to the signal output terminal OUT+. A second terminal (or electrode) of the BAW resonator 122 may be connected to the signal input terminal IN− and the signal output terminal OUT−. In embodiments implementing a shared piezoelectric layer, the first terminals and second terminals of the BAW resonators 120a, 120n, and 122 are connected to electrodes on opposite sides of the shared piezoelectric layer from the corresponding first terminals and second terminals of the BAW resonators 110a, 110n, and 112 (e.g., described below in connection with FIGS. 5 and 6).

Figure 4:
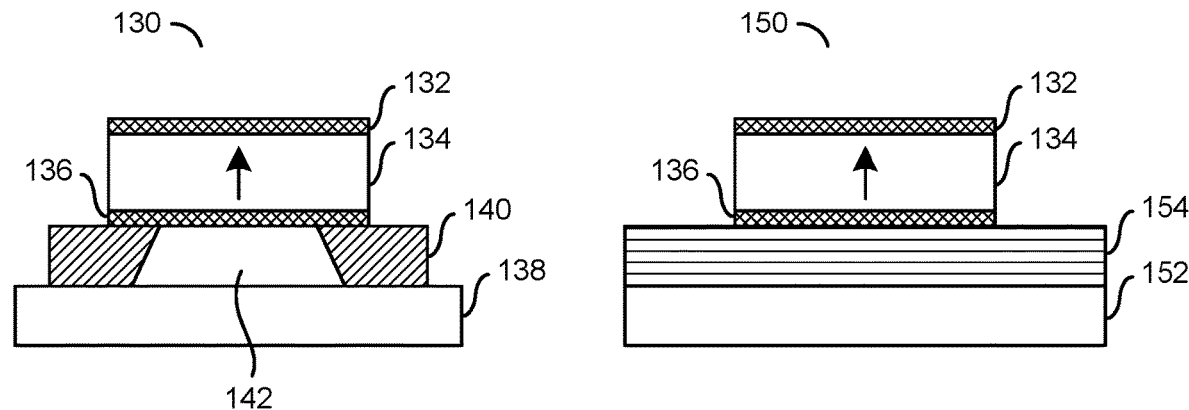
FIG. 4 is a cross-sectional diagram illustrating example bulk acoustic resonators in accordance with example embodiments of the invention.

In an example, each of the BAW resonators 110a, 110n, 112, 120a, 120n, and 122 may have (i) an acoustically active area that is scaled to approximately one-half of the acoustically active area of the corresponding full-area (unscaled) resonator in the conventional filter and (ii) substantially the same resonant frequencies as the corresponding full-area (unscaled) resonator in the conventional filter. In some embodiments, minor differences in area scaling may result in resonators having areas ranging from 45% to 55% of the acoustically active area of the corresponding full-area resonator in the conventional filter. In an example implementing a replacement for the filter circuit 10, the BAW resonators 110a and 120a may have a first acoustically active area (e.g., AS1/2), the BAW resonators 110n and 120n may have a second acoustically active area (e.g., AS2/2), and the BAW resonators 112 and 122 may have a third acoustically active area (e.g., AP1/2). Referring to FIG. 4, a cross-sectional diagram is shown illustrating example bulk acoustic resonators in accordance with example embodiments of the invention. Due to the small size, high Q values, and low insertion losses at microwave frequencies, particularly those above 1.5 Gigahertz (GHZ), bulk acoustic wave (BAW) devices have been widely used in modern wireless applications. For instance, BAW filters are the filter of choice for many 3rd Generation (3G) and 4th Generation (4G) wireless devices and are destined to dominate filter applications for 5th Generation (5G) wireless devices. The low insertion loss of the BAW filter provides many advantages such as improved battery life, compensation for higher losses associated with the need to support many frequency bands in a single mobile device, etc. Because bulk acoustic wave (BAW) filters have high resonance frequencies and high quality (Q), BAW resonators have been widely used, particular in mobile radio communication.

BAW resonators may have various configurations. In an example, BAW resonators may be differentiated between a thin-film bulk acoustic resonator (FBAR) 130 and a solidly mounted resonator (SMR) 150. In another example, BAW resonators may be differentiated between BAW resonators having one piezoelectric layer and BAW resonators having a plurality of piezoelectric layers. In general, embodiments of the invention may be applied to filters implemented using either FBARs or SMRS.

In an example, both the FBAR 130 and the SMR 150 generally comprise a stack including a first (top) electrode 132 coupled to a first side of a piezoelectric layer 134 and a second (bottom) electrode 136 coupled to a second side of the piezoelectric layer 134. In some embodiments, the piezoelectric layer 134 may have a thickness of 0.5-3 micrometers. In some embodiments, the dimensions of the electrodes 132 and 136 in the respective planes of the electrodes 132 and 136 may be 50-1000 micrometers. When the stack is implemented in an FBAR configuration, the stack is supported with respect to a substrate 138 by one or more support structures 140. In some embodiments, the support structures 140 support the top electrode 132, the piezoelectric layer (s) 134, and/or the bottom electrode 136 suspended above the substrate 138 (e.g., forming a cavity 142). The cavity 142 provides a space between the substrate 138 and the piezoelectric layer 134 in which the FBAR stack is free to vibrate in response to electrical signals provided between the top electrode 132 and the bottom electrode 136. When the stack is implemented in an SMR configuration, the stack is generally implemented with a substrate 152 and a reflector region 154. In an example, the reflector region 154 may be formed by a stack of reflector layers, which alternate in material composition to produce a significant combined reflection.

In various embodiments, the stack generally vibrates mechanically in response to an electrical signal applied between the top electrode 132 and the bottom electrode 136. Typical piezoelectric materials may include, but are not limited to, aluminum nitride (AlN), zinc oxide (ZnO), quartz, lithium niobate (LiNbO$_3$), and lithium tantalate (LiTaO$_3$). The designations top electrode and bottom electrode merely serve an identification purpose and do not represent any limitation with regard to the spatial arrangement and/or positioning of the BAW resonators 130 and 150. Rather, the designations top electrode and bottom electrode serve to define the positions of the particular electrodes in relation to the layers deposited on a substrate. In general, the terms top and bottom may refer to up and down when a wafer implementing the BAW resonators is sitting on a table with the side that gets most of the processing facing up.

In general, a direction of mechanical deformation, expansion or contraction, of the BAW resonators depends on the crystal orientation of the piezoelectric layer 134 (e.g., illustrated by an arrow in FIGS. 4-7) and a direction of an electric field applied between the top electrode 132 and the bottom electrode 136. In an example, an up-arrow is used to indicate a "normal" crystal orientation and a down-arrow is used to indicate an inverted crystal orientation. In an example, when the piezoelectric layer 134 comprises AlN, the up-arrow could represent the c-axis being up.

When an electric field is applied between the top electrode 132 and the bottom electrode 136 of the BAW resonators 130 and 150, the reciprocal or inverse piezoelectric effect generally causes the BAW resonators 130 and 150 to mechanically expand or contract, depending on the crystal orientation of the piezoelectric material layer 134. For example, given a particular piezoelectric crystal orientation of the BAW resonators 130 and 150, an electric field applied in a first direction between the first (top) electrode 132 and the second (bottom) electrode 136 may cause a thickness contraction of the BAW resonators 130 and 150, while an opposite electric field applied between the top electrode 132 and the bottom electrode 136 of the BAW resonators 130 and 150, may cause a thickness expansion. When an alternating field is applied between the first (top) electrode 132 and the second (bottom) electrode 136 of the BAW resonators 130 and 150, an acoustic wave is generated in the piezoelectric material layer 134, and, depending on the implementation of the BAW resonators 130 and 150, the wave may propagate, for example, in parallel with the electric field, as a longitudinal wave perpendicular to the surface. The wave will be reflected, for example, at every material interface.

In general, a wavelength, fundamental resonance frequency, resonance states, and/or acoustic resonance vibrations are related to a thickness d of the piezoelectric material layer 134 and thicknesses and structure of the top and bottom electrodes 132 and 136. The piezoelectric properties and, thus, also the electrical properties of the BAW resonators 130 and 150 depend on various factors (e.g., on the piezoelectric and other material properties, the production method, and the crystal orientation of the piezoelectric material). Thus, the BAW resonators 130 and 150 have resonant frequencies that may be specified externally by design. In an example, the resonance frequencies, in particular, depend on the thickness d of the piezoelectric layer 134, as well as the thickness and material properties of the electrodes and any other layers of the BAW resonators 130 and 150.

During fabrication, a layer may be formed containing the bottom electrode 136. The piezoelectric layer 134 may then formed (deposited, grown, etc.) on top of the bottom electrode layer. The top electrode 132 may then formed on a top surface of the piezoelectric layer 134. Thus, the top electrode 132 and the bottom electrode 136 are on opposite surfaces of the piezoelectric layer 134. An active region (AR) for the BAW resonator 130 (or 150) is formed where the top electrode 132 and the bottom electrode 136 overlap. The active region also includes the layers between and below the overlapping top and bottom electrodes 132 and 136. Other sections of the BAW resonator 130 (or 150) that surround the active region AR are generally referred to as outside regions (OR). The connections to the top electrode 132 and the bottom electrode 136 generally reside within the outside regions OR. In operation, acoustic waves in the piezoelectric layer 134 within the active region AR of the BAW resonator 130 (or 150) are excited by an electrical signal applied to the top and bottom electrodes 132 and 136. The frequency at which resonance of the acoustic waves occurs is a function of the thickness of the electrodes 132 and 136, the piezoelectric layer 134, and any other layers in the active region AR.

Figure 5:
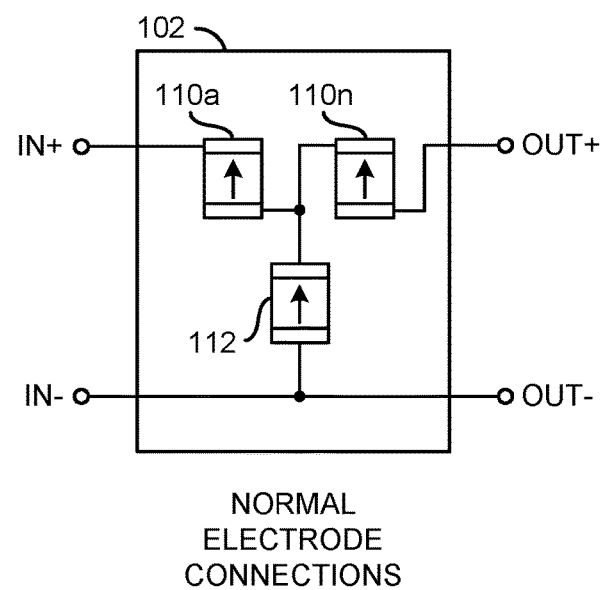

Referring to FIG. 5, a diagram is shown illustrating an example implementation of the normally connected (+) filter 102 of FIG. 3 in accordance with an embodiment of the invention. In an example, the signal input terminal IN+ may be connected to the top electrode of the BAW resonator 110a. The bottom electrode of the BAW resonator 110a may be connected to the top electrode of the BAW resonator 110n and the top electrode of the BAW resonator 112. The bottom electrode of the BAW resonator 110n may be connected to the signal output terminal OUT+. The bottom electrode of the BAW resonator 112 may be connected to the signal input terminal IN− and the signal output terminal OUT−.

Referring to FIG. 6, a diagram is shown illustrating an example implementation of the reverse connected (−) filter 104 of FIG. 3 in accordance with an embodiment of the invention. In an example, the filter 104 may comprise BAW resonators having the same piezoelectric crystal orientation (e.g., illustrated by the up-arrow) as the BAW resonators of the filter 102, but with the connections to the individual electrodes of each BAW resonator reversed in comparison to the filter 102. The signal input terminal IN+ may be connected to the bottom electrode of the BAW resonator 120a. The top electrode of the BAW resonator 120a may be connected to the bottom electrode of the BAW resonator 120n and the bottom electrode of the BAW resonator 122. The top electrode of the BAW resonator 120n may be connected to the signal output terminal OUT+. The top electrode of the BAW resonator 122 may be connected to the signal input terminal IN− and the signal output terminal OUT−.

Referring to FIG. 7, a diagram of a filter circuit 204 is shown illustrating another example implementation of the reverse connected (−) filter 104 of FIG. 3 in accordance with another embodiment of the invention. In an example, the filter circuit 204 may comprise BAW resonators having an opposite (reversed) piezoelectric crystal orientation (e.g., illustrated by the down-arrow) from the BAW resonators of the filter 102, but with the same BAW resonator electrode connections as the filter 102. Reversing the piezoelectric crystal orientation between two half-area filter circuits may be difficult for aluminum nitride FBARS. However, reversing the piezoelectric crystal orientation between two half-area filter circuits would be relatively easy when the individual resonators are made of quartz, lithium niobate, or lithium tantalate and fabricated as single-resonator chips that may be assembled together.

In an example, the signal input terminal IN+ may be connected to the top electrode of a BAW resonator 220a. The bottom electrode of the BAW resonator 220a may be connected to the top electrode of a BAW resonator 220n and the top electrode of a BAW resonator 222. The bottom electrode of the BAW resonator 220n may be connected to the signal output terminal OUT+. The bottom electrode of the BAW resonator 222 may be connected to the signal input terminal IN− and the signal output terminal OUT−.

Referring to FIG. 8, a top view diagram is shown illustrating example wafer implementations of the filters of FIGS. 1 and 3 in accordance with an example embodiment of the invention. A wafer 300 is shown illustrating the filter circuit 10 of FIG. 1 implemented using conventional techniques (bottom electrodes, interconnections, and vias not shown). A wafer 310 is shown illustrating the filter circuit 100 of FIG. 3 implemented using a technique in accordance with an example embodiment of the invention (bottom electrodes, interconnections, and vias not shown). In an example, the wafer 300 may comprise a BAW resonator 302, a BAW resonator 304, and a BAW resonator 306. The BAW resonators 302, 304, and 306 may be implemented as conventional full-area BAW resonators. In an example, the BAW resonator 302 may be configured to implement the BAW resonator FS1 of FIG. 1. The BAW resonator 304 may be configured to implement the BAW resonator FP1 of FIG. 1. The BAW resonator 306 may be configured to implement the BAW resonator FS2 of FIG. 1. The respective top and bottom electrodes of the BAW resonators 302, 304, and 306 may be connected to each other and to the input and output terminals to implement a normally connected (+) filter circuit (e.g., illustrated in FIG. 5) matching the layout of the filter circuit of FIG. 1.

In an example, the wafer 310 may comprise a BAW resonator 312, a BAW resonator 314, a BAW resonator 316, a BAW resonator 318, a BAW resonator 320, and a BAW resonator 322. The BAW resonators 312, 314, and 316 may be implemented as normally connected, half-area versions of the BAW resonators 302, 304, and 306, respectively. In an example, the BAW resonators 312, 314, and 316 may be implemented having substantially similar shapes to the corresponding one of the BAW resonators 302, 304, and 306. The BAW resonators 318, 320, and 322 may be implemented as reverse connected (−), half-area versions of the BAW resonators 302, 304, and 306, respectively. In an example, the BAW resonators 312, 314, and 316 may be implemented having substantially similar shapes to the corresponding ones of the BAW resonators 302, 304, and 306. In general, the term substantially similar shape is used to take into account that exact matches may not be possible due to slight variations that may occur in lithographic and etching processes.

In an example, the BAW resonator 312 may be configured to implement the BAW resonator 110a of FIG. 3. The BAW resonator 314 may be configured to implement the BAW resonator 112 of FIG. 3. The BAW resonator 316 may be configured to implement the BAW resonator 110n of FIG. 3. The respective top and bottom electrodes of the BAW resonators 312, 314, and 316 may be connected to each other and to the input and output terminals to implement the normally connected (+) (e.g., as illustrated in FIG. 5) half-area BAW filter 102 of FIG. 3. In an example, the BAW resonator 318 may be configured to implement the BAW resonator 120a of FIG. 3. The BAW resonator 320 may be configured to implement the BAW resonator 122 of FIG. 3. The BAW resonator 322 may be configured to implement the BAW resonator 120n of FIG. 3. The respective top and bottom electrodes of the BAW resonators 318, 320, and 322 may be connected to each other and to the input and output terminals to implement the reverse connected (−) half-area BAW filter 104 of FIG. 3. In an example, the BAW resonators 318, 320, and 322 may be connected as illustrated in either FIG. 6 or FIG. 7.

In general, the interconnections of the group of BAW resonators 302, 304, and 306, the group of BAW resonators 312, 314, and 316, and the group BAW resonators 318, 320, and 322 are configured such that each group of BAW resonators has the same circuit topology (e.g., as illustrated in FIGS. 1 and 3), except for areas and that either (i) the particular electrodes used to interconnect the BAW resonators 318, 320, and 322 are reversed with respect to the electrode interconnections of the BAW resonators 312, 314, and 316 or (ii) the piezoelectric crystal orientation of the BAW resonators 318, 320, and 322 is inverted relative to the BAW resonators 312, 314, and 316. The filter circuit implemented on the wafer 310 is generally formed by connecting the half-area filter comprising the BAW resonators 312, 314, and 316 in parallel with the half-area filter comprising the BAW resonators 318, 320, and 322 at the input terminals IN+ and IN− and the output terminals OUT+ and OUT−.

Referring to FIG. 9, a diagram is shown illustrating another example implementation of a filter design in accordance with an embodiment of the invention. In an example, a filter circuit 100' may be implemented using two half-area bulk acoustic wave (BAW) filters 102' and 104' connected in parallel in accordance with an example embodiment of the invention (e.g., as described above in connection with FIG. 2). In an example, each of the half-area bulk acoustic wave (BAW) filters 102' and 104' may comprise a bulk acoustic wave (BAW) filter comprising a plurality of resonators with an unbalanced ladder topology. The plurality of resonators may be implemented as thin-film bulk acoustic resonators (FBARs) or solidly mounted resonators (SMRs).

In an example, the half-area bulk acoustic wave (BAW) filter 102' may comprise a number of series connected BAW resonators 110a-110n, and a number of shunt connected BAW resonators 112a-112n. In an example, each of the BAW resonators 110a-110n and 112a-112n may be implemented as normally connected (+) thin-film bulk acoustic resonators (FBARS). In another example, each of the BAW resonators 110a-110n and 112a-112n may be implemented as normally connected (+) solidly mounted resonators (SMRs). In an example, the half-area bulk acoustic wave (BAW) filter may comprise a number of series connected BAW resonators 120a-120n and a number of shunt connected BAW resonators 122a-122n. In an example, each of the BAW resonators 120a-120n and 122a-122n may be implemented as reverse connected (−) thin-film bulk acoustic resonators (FBARs). In another example, each of the BAW resonators 120a-120n and 122a-122n may be implemented as reversed connected (−) solidly mounted resonators (SMRs). In an example embodiment using AlN or ZnO as the piezoelectric crystal material, the BAW resonators 110a-110n, 112a-112n, 120a-120n, and 122a-122n may share the same piezoelectric layer. In an example embodiment using quartz, lithium niobate, or lithium tantalate as the piezoelectric crystal material, the BAW resonators 110a-110n, 112a-112n, 120a-120n, and 122a-122n may be fabricated as single-resonator chips that are assembled together.

In an example, the filter 102' may include a number of series branches implemented between the BAW resonators 110a and 110n and a number of parallel branches implemented between the BAW resonators 112a and 112n (e.g., illustrated by the ellipses). The filter 104' may similarly include a corresponding number of series branches with corresponding resonant frequencies and areas between the BAW resonators 120a and 120n and a corresponding number of parallel branches with corresponding resonant frequencies and areas between the BAW resonators 122a and 122n (e.g., illustrated by the ellipses). In various embodiments, the filters 102' and 104' may be also implemented comprising series and/or parallel branches that may have series or parallel combinations of resonators, and/or series and/or parallel branches that have additional non-BAW components (e.g., inductors, capacitors, etc.). In an example, an inductor may be connected in shunt at the input to improve an impedance match and reduce loss.

Referring to FIG. 10, a diagram is shown illustrating another example implementation of a filter design in accordance with an embodiment of the invention. In an example, a filter circuit 400 may be implemented using two half-area bulk acoustic wave (BAW) filters 402 and 404 connected in parallel in accordance with an example embodiment of the invention (e.g., as described above in connection with FIG. 2). In an example, each of the half-area bulk acoustic wave (BAW) filters 402 and 404 may comprise a bulk acoustic wave (BAW) filter comprising a plurality of resonators with a balanced (differential) ladder topology. In an example, each of the half-area bulk acoustic wave (BAW) filters 402 and 404 may implement an H-section circuit topology. However, it would be apparent to a skilled artisan that the filters 402 and 404 may be implemented using balanced circuit topologies comprising one or more sections (or stages), a plurality of series branches, and/or a plurality of shunt branches, and/or a plurality of diagonal branches to meet design criteria of a particular application.

In an example, the half-area bulk acoustic wave (BAW) filter 402 may comprise two series connected BAW resonators 410a and 410b, a shunt connected BAW resonator 412, and two series connected BAW resonators 414a and 414b. The shunt connected BAW resonator 412 may be connected between a first node formed by interconnection of the BAW resonators 410a and 410b and a second node formed by interconnection of the BAW resonators 414a and 414b. In an example, each of the BAW resonators 410a, 410b, 412, 414a, and 414b may be implemented as normally connected (+) thin-film bulk acoustic resonators (FBARs) or solidly mounted resonators (SMRs).

In an example, the half-area bulk acoustic wave (BAW) filter 404 may comprise two series connected BAW resonators 420a and 420b, a shunt connected BAW resonator 422, and two series connected BAW resonators 424a and 424b. The shunt connected BAW resonator 422 may be connected between a first node formed by interconnection of the BAW resonators 420a and 420b and a second node formed by interconnection of the BAW resonators 424a and 424b. In an example, each of the BAW resonators 420a, 420b, 422, 424a, and 424b may be implemented as reverse connected (−) thin-film bulk acoustic resonators (FBARs) or solidly mounted resonators (SMRs). In an example embodiment using AlN or ZnO as the piezoelectric crystal material, the BAW resonators 410a, 410b, 412, 414a, 414b, 420a, 420b, 422, 424a, and 424b may share the same piezoelectric layer. In an example embodiment using quartz or lithium niobate as the piezoelectric crystal material, the BAW resonators 410a, 410b, 412, 414a, 414b, 420a, 420b, 422, 424a, and 424b may be fabricated as single-resonator chips that are assembled together.

Referring to FIG. 11, a diagram is shown illustrating another example implementation of a filter design in accordance with an embodiment of the invention. In an example, a filter circuit 500 may be implemented using two half-area bulk acoustic wave (BAW) filters 502 and 504 connected in parallel in accordance with an example embodiment of the invention (e.g., as described above in connection with FIG. 2). In an example, each of the half-area bulk acoustic wave (BAW) filters 502 and 504 may comprise a bulk acoustic wave (BAW) filter comprising a plurality of resonators with a multistage lattice filter topology.

In an example, the half-area bulk acoustic wave (BAW) filter 502 may comprise two lattice filter sections 502a and 502b. The filter section 502a may comprise a BAW resonator 510a, two diagonally connected BAW resonators 512a and 512b, and a BAW resonator 514a. The filter section 502b may comprise a BAW resonator 510b, two diagonally connected BAW resonators 512c and 512d, and a BAW resonator 514b. In an example, each of the BAW resonators 510a, 510b, 512a-512d, 514a, and 514b may be implemented as a normally connected (+) thin-film bulk acoustic resonator (FBAR) or a solidly mounted resonator (SMR). In an example, the half-area bulk acoustic wave (BAW) filter 504 may comprise two lattice filter sections 504a and 504b. The filter section 504a may resonator 520a, two diagonally connected BAW comprise a BAW resonators 522a and 522b, and a BAW resonator 524a. The filter section 504b may comprise a BAW resonator 520b, two diagonally connected BAW resonators 522c and 522d, and a BAW resonator 524b. In an example, each of the BAW resonators 520a, 520b, 522a-522d, 524a, and 524b may be implemented as a reverse connected (+) thin-film bulk acoustic resonator (FBAR) or a solidly mounted resonator (SMR). In an example embodiment using AlN or ZnO as the piezoelectric crystal material, the BAW resonators 510a, 510b, 512a-512d, 514a, 514b, 520a, 520b, 522a-522d, 524a, and 524b may share the same piezoelectric layer. In an example embodiment using quartz, lithium niobate, or lithium tantalate as the piezoelectric crystal material, the BAW resonators 510a, 510b, 512a-512d, 514a, 514b, 520a, 520b, 522a-522d, 524a, and 524b may be fabricated as single-resonator chips that are assembled together. In various embodiments, the BAW resonators 520a, 520b, 522a-522d, 524a, and 524b generally have substantially the same resonant frequencies and areas as the corresponding BAW resonators 510a, 510b, 512a-512d, 514a, and 514b.

In an example, the BAW resonators 510a, 512a, 512b, and 514a may be connected to form a first lattice portion (or section) 502a of the filter 502, and the BAW resonators 510b, 512c, 512d, and 514b may be connected to form a second lattice portion (or section) 502b of the filter 502. In an example, the BAW resonators 520a, 522a, 522b, and 524a may be connected to form a first lattice portion (or section) 504a of the filter 504, and the BAW resonators 520b, 522c, 522d, and 524b may be connected to form a second lattice portion (section) 504b of the filter 504.

In an example, input terminals of the filter 500 may be connected to an input side of the first lattice portion 502a of the filter 502 and an input side of the first lattice portion 504a of the filter 504, an output side of the first lattice portion 502a of the filter 502 and an output side of the first lattice portion 504a of the filter 504 may be connected to an input side of the second lattice portion 502b of the filter 502 and an input side of the second lattice portion 504b of the filter 504, respectively, and output terminals of the filter 500 may be connected to an output side of the second lattice portion 502b of the filter 502 and an output side of the second lattice portion 504b of the filter 504. Although ladder and lattice filters have been illustrated separately, it would be apparent to a skilled artisan that the filters 102 and 104 may also be implemented using mixed ladder-lattice circuit topologies comprising one or more sections (or stages), a plurality of series branches, and/or a plurality of shunt branches, and/or a plurality of diagonal branches to meet design criteria of a particular application.

Referring to FIG. 12, a diagram of a circuit 600 is shown illustrating a context in which a filter in accordance with an example embodiment of the invention may be utilized. In an example, filter circuits implemented similarly to the filter circuit 100 as described above in connection with FIG. 2 (e.g., using two filter circuits comprising half-area bulk acoustic wave (BAW) filters, with opposite piezoelectric crystal orientation or reversed electrode connections, connected in parallel in accordance with an example embodiment of the invention) may be utilized as part of a radio frequency front end (e.g., in cellular phones, transceivers, etc.). In an example, the circuit 600 may comprise a block (or circuit) 602, a block (or circuit) 604, and a block (or circuit) 606. The circuit 602 may be implemented as a baseband circuit. The circuit 604 may implement a transceiver circuit. The circuit 606 may implement a radio frequency front end (RFFE). In an example, the baseband circuit 602 may communicate baseband signals to and receive baseband signals from the transceiver circuit 604. The transceiver circuit 604 may be configured to convert the baseband signals received from the baseband circuit 602 to radio frequency signals for broadcast. The transceiver circuit 604 may be further configured to convert RF signals received via a broadcast to baseband signals for communication to the baseband circuit 602.

The radio frequency front end circuit 606 may be configured to couple the transceiver circuit 604 to an antenna 608. In an example, the radio frequency front end circuit 606 may comprise a low noise amplifier (LNA) stage 610, a power amplifier (PA) stage 612, and a duplexer 614. In an example, the duplexer 614 may comprise a receive band filter 616, a transmit band filter 618, and a 90° phase shifter 620. In an example, the receive band filter 616 and/or the transmit band filter 618 may each be implemented similarly to the filter circuit 100 as described above in connection with FIG. 2 using two filter circuits comprising half-area bulk acoustic wave (BAW) filters, with opposite piezoelectric crystal orientation or reversed electrode connections, connected in parallel in accordance with an example embodiment of the invention.

An input of the low noise amplifier 610 may be coupled to an output of the receive band filter 616. An output of the power amplifier 612 may be coupled to an input of the transmit band filter 618. An input of the receive band filter 616 may be coupled to an output of the 90° phase shifter 620. The antenna 608 may be coupled to an output of the transmit band filter 618 and an input of the 90° phase shifter 620. On the output of the power amplifier 612, the transmit band filter 618 may be applied to the transmitted power to make sure there is no illegal leaked power outside of a permitted transmit band. On the input of the low noise amplifier 610, the receive band filter 616 may be applied to protect the low noise amplifier 610 from transmitted power at nearby frequencies on the same antenna 608.

Although filters have been described using half-area examples, filters may be implemented in accordance with embodiments of the invention having area ratios other a half and still cancel the second harmonics. When a filter implemented with two half-area filters is derived from a single filter design, the filter may look very much like the single filter. However, a larger ratio may be implemented when desirable because of some performance tradeoff related to the specification. For example, a larger filter may improve the loss, power handling and linearity, but possibly degrade out-of-band rejection. In another example, a designer may design a filter from the start as a two-filter combination, and just scale the filter up or down in size until the best compromise in specification performance is achieved.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a signal input port;
   a signal output port;
   a first filter path connected from said signal input port to said signal output port and comprising a first plurality of resonators; and
   a second filter path connected from said signal input port to said signal output port and comprising a second plurality of resonators,
   wherein (i) the first plurality of resonators comprise piezoelectric material, (ii) the second plurality of resonators comprise piezoelectric material, (iii) at least two of the first plurality of resonators are arranged in series between the signal input port and the signal output port, (iv) at least two of the second plurality of resonators are arranged in series between the signal input port and the signal output port, (v) the second plurality of resonators are reverse connected relative to the first plurality of resonators, (vi) the first filter path is connected in parallel with the second filter path such that (a) the first filter path is independent of the second filter path, and (b) second harmonic emissions of the first filter path are substantially canceled by second harmonic emissions of the second filter path, and (vii) the apparatus comprises a bulk acoustic wave (BAW) filter.

2. The apparatus of claim 1, wherein:
   the signal port comprises a first terminal configured to receive an input signal and a second terminal connected to a circuit ground potential; and
   the signal output port comprises a third terminal configured to present an output signal and a fourth terminal connected to the circuit ground potential.

3. The apparatus of claim 1, wherein a number of the first plurality of resonators matches a number of the second plurality of resonators.

4. The apparatus of claim 1, wherein:
   the first filter path comprises at least one of a multistage ladder filter and a multistage lattice filter; and
   the second filter path comprises at least one of a multistage ladder filter and a multistage lattice filter.

5. The apparatus of claim 1, wherein a first total acoustically active area of the first filter path comprising the first plurality of resonators substantially matches a second total acoustically active area of the second filter path comprising the second plurality of resonators.

6. The apparatus of claim 5, wherein (i) the first plurality of resonators comprises thin-film bulk acoustic resonators (FBARs) and (ii) the second plurality of resonators comprises FBARS.

7. The apparatus of claim 1, wherein (i) one terminal of a third resonator of the first plurality of resonators is connected to a node formed by connection of the at least two of the first plurality of resonators connected in series and (ii) one terminal of a third resonator of the second plurality of resonators is connected to a node formed by connection of the at least two of the second plurality of resonators connected in series.

8. The apparatus of claim 7, wherein (i) a second terminal of the third resonator of the first plurality of resonators is connected to a circuit ground potential and (ii) a second terminal of the third resonator of the second plurality of resonators is connected to the circuit ground potential.

9. The apparatus of claim 7, wherein (i) the first filter path comprises a first ladder structure and (ii) the second filter path comprises a second ladder structure.

10. The apparatus of claim 9, wherein (i) the first ladder structure comprises a plurality of series branches and a plurality of shunt branches, and (ii) the second ladder structure comprises a corresponding plurality of series branches and a corresponding plurality of shunt branches.

11. The apparatus of claim 9, wherein (i) the first plurality of resonators is configured as a first BAW filter and (ii) the second plurality of resonators is configured as a second BAW filter.

12. The apparatus of claim 1, wherein (i) the first filter path and the second filter path are configured together to (a) match a chip area layout and connection pattern of a single filter path BAW filter circuit comprising a third plurality of resonators and (b) have reduced second harmonic emissions relative to the single filter path BAW filter circuit, and (ii) a total acoustically active area of the first plurality of resonators of the first filter path and the second plurality of resonators of the second filter path covers an area substantially matching a total acoustically active area of the third plurality of resonators of the single filter path BAW filter circuit.

13. The apparatus of claim 12, wherein the total acoustically active area of the first plurality of resonators of the first filter path is approximately half the total acoustically active area of the third plurality of resonators 4 of the single filter path BAW filter circuit and the total acoustically active area of the second plurality of resonators of the second filter path is approximately half the total acoustically active area of the third plurality of resonators of the single filter path BAW filter circuit.

14. The apparatus of claim 12, wherein:
each of the first plurality of resonators of the first filter path has a corresponding resonator in the second plurality of resonators of the second filter path;
the first plurality of resonators of the first filter path, the second plurality of resonators of the second filter path, and the third plurality of resonators of the single filter path BAW filter circuit have matching filter circuit topologies; and
the second plurality of resonators of the second filter path are configured such that respective output second harmonic phases of the first filter path and the second filter path are opposite and have substantially equal magnitudes.

15. The apparatus of claim 12, wherein an acoustically active area of each resonator of the first plurality of resonators of the first filter path substantially matches an acoustically active area of a corresponding resonator of the third plurality of resonators of the single filter path BAW filter circuit scaled by approximately one-half, respective resonant frequencies of each resonator of the first plurality of resonators of the first filter path substantially matches respective resonant frequencies of the corresponding resonator of the third plurality of resonators of the single filter path BAW filter circuit, and an acoustically active area plurality of resonators of the second filter path substantially matches the acoustically active area and respective resonant frequencies of a corresponding resonator of the first plurality of resonators of the first filter path.

16. The apparatus of claim 12, wherein a shape of each resonator of the first plurality of resonators of the first filter path substantially matches a shape of a corresponding resonator of the third plurality of resonators of the single filter path BAW filter circuit scaled by approximately one-half in an active area, and a shape of each resonator of the second plurality of resonators of the second filter path substantially matches the shape and active area of a corresponding resonator of the first plurality of resonators of the first filter path.

17. The apparatus of claim 1, wherein the second plurality of resonators are reverse connected relative to the first plurality of resonators by switching connections in the second plurality of resonators between a top electrode and a bottom electrode of each resonator of the second plurality of resonators.

18. The apparatus of claim 1, wherein the second plurality of resonators are reverse connected relative to the first plurality of resonators by inverting a piezoelectric crystal orientation of the second plurality of resonators.

19. The apparatus of claim 1, wherein the piezoelectric material comprises at least one of aluminum nitride (AlN), zinc oxide (ZnO), quartz, lithium niobate ($LiNbO_3$), and lithium tantalate ($LiTaO_3$).

20. The apparatus of claim 1, wherein the first plurality of resonators and the second plurality of resonators are part of a monolithic microwave integrated circuit.

* * * * *